(12) United States Patent
Tomiyoshi et al.

(10) Patent No.: US 8,760,035 B2
(45) Date of Patent: Jun. 24, 2014

(54) ELECTROMECHANICAL TRANSDUCER AND METHOD OF PRODUCING THE SAME

(75) Inventors: Toshio Tomiyoshi, Yokohama (JP); Kazutoshi Torashima, Yokohama (JP); Takahiro Akiyama, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 112 days.

(21) Appl. No.: 13/436,336

(22) Filed: Mar. 30, 2012

(65) Prior Publication Data

US 2012/0256519 A1 Oct. 11, 2012

(30) Foreign Application Priority Data

Apr. 6, 2011 (JP) ................................. 2011-084673

(51) Int. Cl.
*H01L 41/047* (2006.01)

(52) U.S. Cl.
USPC ......................................... 310/322; 310/365

(58) Field of Classification Search
USPC ..................... 310/300, 322, 365, 366; 427/58
See application file for complete search history.

(56) References Cited

U.S. PATENT DOCUMENTS

| 8,288,192 | B2 * | 10/2012 | Chang .............................. 438/54 |
| 2005/0177045 | A1 * | 8/2005 | Degertekin et al. ........... 600/457 |
| 2009/0142872 | A1 * | 6/2009 | Park et al. ....................... 438/50 |
| 2010/0327380 | A1 * | 12/2010 | Chang ........................... 257/419 |
| 2011/0305822 | A1 * | 12/2011 | Hasegawa et al. ............... 427/58 |
| 2012/0256518 | A1 * | 10/2012 | Torashima et al. ........... 310/300 |
| 2013/0049527 | A1 * | 2/2013 | Hasegawa et al. ............ 310/300 |
| 2013/0069480 | A1 * | 3/2013 | Akiyama et al. .............. 310/300 |
| 2013/0126993 | A1 * | 5/2013 | Torashima et al. ........... 257/416 |

FOREIGN PATENT DOCUMENTS

| JP | 2001-313999 A | 11/2001 |
| JP | 2008-114319 A | 5/2008 |

* cited by examiner

*Primary Examiner* — Derek Rosenau

(74) *Attorney, Agent, or Firm* — Canon USA, Inc. IP Division

(57) ABSTRACT

An electromechanical transducer includes a substrate, a first electrode disposed on the substrate, and a vibration film including a membrane disposed on the first electrode with a space therebetween and a second electrode disposed on the membrane so as to oppose the first electrode. The first electrode has a surface roughness value of 6 nm RMS or less.

17 Claims, 4 Drawing Sheets

_US 8,760,035 B2_

ELECTROMECHANICAL TRANSDUCER AND METHOD OF PRODUCING THE SAME

BACKGROUND OF THE INVENTION

1. Field of the Invention

One disclosed aspect of embodiments relate to an electromechanical transducer and a method of producing the transducer. More specifically, an embodiment relates to an electromechanical transducer that is used as ultrasonic transducers and a method of producing the transducer.

2. Description of the Related Art

Electromechanical transducers such as capacitive micromachined ultrasonic transducers (CMUTs) produced by micromachining technology have been being researched as substitutes for piezoelectric transducers. These capacitive electromechanical transducers may receive and transmit ultrasonic waves with vibration of vibration films.

As a method of producing a CMUT, U.S. Patent Publication No. 2005/0177045 describes a method where a cavity is formed by etching of a sacrificial layer. In the method described in U.S. Patent Publication No. 2005/0177045, in order to prevent an upper electrode from being etched during the etching of the sacrificial layer, a second electrode is disposed between a first membrane and a second membrane, and the sacrificial layer is etched.

As in the method described in U.S. Patent Publication No. 2005/0177045, a CMUT is produced by sequentially stacking a lower electrode, an insulating film, an upper electrode, and a membrane on a substrate. In the case of forming a plurality of layers, the thicknesses of the layers tends to vary. If the thicknesses of layers are different among cells or elements, the frequency characteristics among the cells or the elements vary.

SUMMARY OF THE INVENTION

In the present invention, the variation in frequency characteristics among cells or elements may be reduced.

The electromechanical transducer according to aspects of the present invention includes a substrate; a first electrode disposed on the substrate; and a vibration film including a membrane disposed on the first electrode with a space therebetween and a second electrode disposed on the membrane so as to oppose the first electrode. The first electrode has a surface roughness value of 6 nm RMS (root-mean-square) or less.

The method of producing the electromechanical transducer according to aspects of the present invention includes a step of forming a first electrode on a substrate; a step of forming a sacrificial layer on the first electrode; a step of forming a membrane on the sacrificial layer; a step of forming a second electrode on the membrane; and a step of forming an etching-hole in the membrane and removing the sacrificial layer through the etching-hole. The first electrode is formed so as to have a surface roughness value of 6 nm RMS or less.

The present invention may reduce the variation in frequency characteristics among cells or elements by optimizing the surface conditions of the first electrode.

Further features of the present invention will become apparent from the following description of exemplary embodiments with reference to the attached drawings.

DESCRIPTION OF THE EMBODIMENTS

The present inventors have focused on that the frequency characteristics of a vibration film vary depending on variation in the thickness of each layer formed on a substrate. In particular, the inventors have focused on that the early step of producing an element, i.e., the step of forming a first electrode, is important. In an electromechanical transducer that is produced by stacking a plurality of layers, the layers that are formed in the steps after the formation of the first electrode may have surface shapes reflecting the surface shape of the first electrode. From this point of view, the present inventors have found that there is a certain relationship between the surface roughness of a first electrode and the frequency characteristics of a vibration film.

Based on this relationship, the embodiment provides a first electrode having a surface roughness value of 6 nm RMS or less. An embodiment will now be described with reference to the drawings.

Configuration of Electromechanical Transducer

Figure 1A:
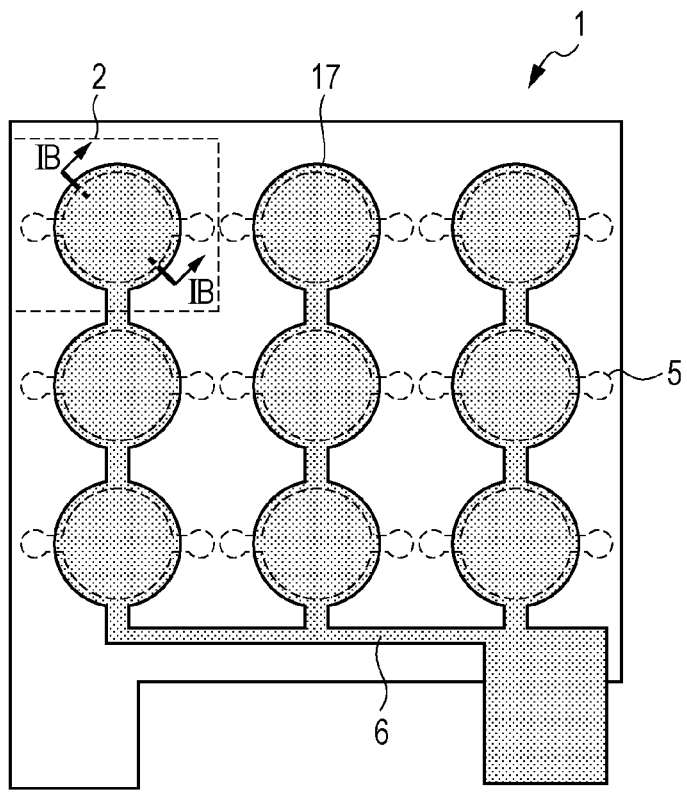
FIGS. 1A and 1B are schematic diagrams illustrating an electromechanical transducer to which Example 1 according to aspects of the present invention may be applied.
Figure 1B:
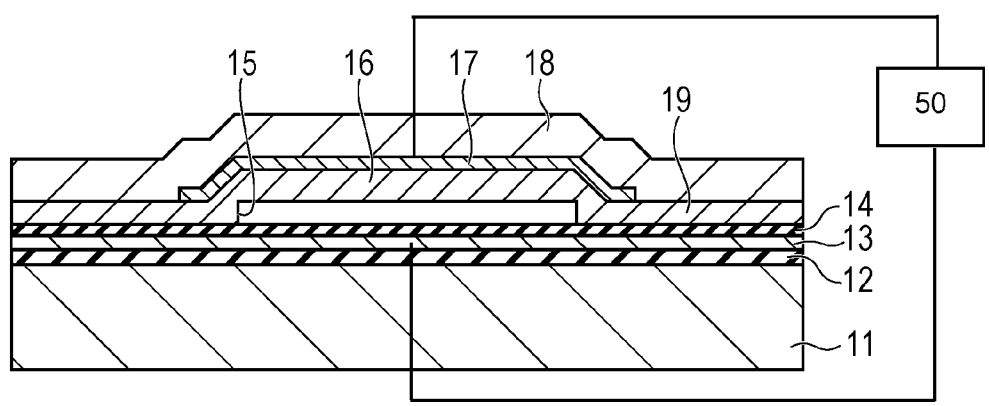

FIG. 1A is a top view of an element 1 of an electromechanical transducer according to aspects of the embodiments, and FIG. 1B is a cross-sectional view taken along line IB-IB of the cell structure 2 surrounded by a dashed line of FIG. 1A. The element 1 of this embodiment includes a plurality of cell structures 2 that are electrically connected to one another. Though FIG. 1A shows only one element, the electromechanical transducer may have a plurality of the elements. In FIG. 1A, the element 1 is composed of nine cell structures 2, but the number of the cell structures is not particularly limited. Furthermore, though the cell structures 2 are arranged in a square lattice form, they may be arranged in any form such as a zigzag form. The cell structures 2 shown in FIG. 1A are circular, but they may be, for example, square or hexagonal.

FIG. 1B is a cross-sectional view of the cell structure 2. The cell structure 2 includes a substrate 11, a first insulating film 12, a first electrode 13, and a second insulating film 14 disposed on the substrate 11. The cell structure 2 further includes a vibration film composed of a first membrane 16, a second electrode 17, and a second membrane 18. The vibration film is arranged on the second insulating film 14 with a space, a cavity 15, therebetween. The first membrane 16 is disposed on the second electrode 17 on the space side (the cavity 15 side) and is supported by a membrane-supporting portion 19. The second membrane 18 is disposed on the second electrode 17 on the opposite side of the cavity 15. The first electrode 13 and the second electrode 17 face to each other with the cavity 15 therebetween, and a voltage is applied between the first electrode 13 and the second electrode 17 with a voltage-applying unit 50.

The electromechanical transducer may detect an electrical signal from the second electrode 17 of each element separately by using lead wiring 6. Though the lead wiring 6 is used for extracting the electrical signal in this embodiment, for example, through-wiring may be used. In this embodiment, both the first electrode 13 and the second electrode 17 are disposed to each element, but either the first electrode 13 or the second electrode 17 may be used as a common electrode. In the case where an electromechanical transducer includes a plurality of elements, the common electrode is electrically connected to all the elements. In also this case, the electrical signal of each element may be separately extracted as long as either the first electrode 13 or the second electrode 17 is separated on an element-to-element basis.

Drive Principle of Electromechanical Transducer

The drive principle of an electromechanical transducer according to aspects of the present invention will be described. In the case of receiving ultrasonic waves by the electromechanical transducer, a power supply unit 50 applies a DC voltage to the first electrode 13 so as to cause a potential difference between the first electrode 13 and the second electrode 17. Reception of ultrasonic waves bends the vibration film having the second electrode 17 to change the distance between the second electrode 17 and the first electrode 13 (the distance in the depth direction of the cavity 15), resulting in a change in capacitance. This change in capacitance causes a flow of an electric current in the lead wiring 6. This current is converted into a voltage by a current-voltage conversion device (not shown) to give an input signal of the ultrasonic waves. As described above, the configuration of the lead wiring may be changed so that a DC voltage is applied to the second electrode 17 and that an electrical signal is extracted from the first electrode 13 of each element.

In the case of transmitting ultrasonic waves, a DC voltage and an AC voltage are applied to the first electrode 13 and the second electrode 17, respectively, and the electrostatic force vibrates the vibration film. This vibration transmits ultrasonic waves. In also the case of transmitting ultrasonic waves, the configuration of the lead wiring 6 may be changed so that the vibration film is vibrated by applying a DC voltage and an Ac voltage to the second electrode 17 and the first electrode 13, respectively. Alternatively, a DC voltage and an AC voltage may be applied to the first electrode 13 or the second electrode 17 to vibrate the vibration film by electrostatic force. Relationship between frequency characteristics of vibration film and surface roughness of first electrode As described above, in the embodiment, the first electrode has a surface roughness value of 6 nm root mean square (RMS) or less. The relationship between the frequency characteristics of the vibration film and the surface roughness of the first electrode will now be described with reference to FIGS. 3A and 3B. Throughout the specification, the surface roughness is measured with an atomic force microscope (AFM) and is shown as roughness root mean square (RMS). The measuring area of the RMS is 5 μm×5 μm. The AFM used for measurement is Nanoscope Dimension 3000 manufactured by Veeco Instruments Inc. The electromechanical transducer used as the measurement object has the same configuration as the electromechanical transducer of Example 1 described below except that the thickness of the first electrode 13 is changed.

Figure 3A:
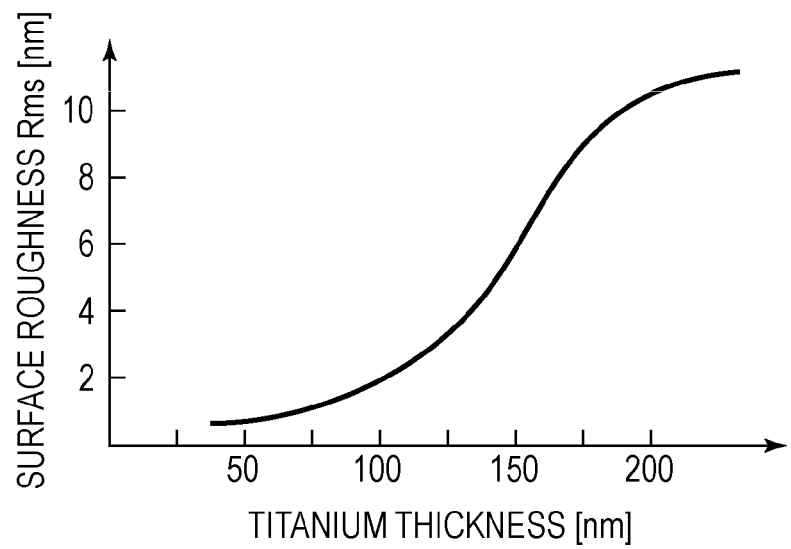
FIG. 3A is a graph showing a relationship between the thickness and the surface roughness of a first electrode.
Figure 3B:
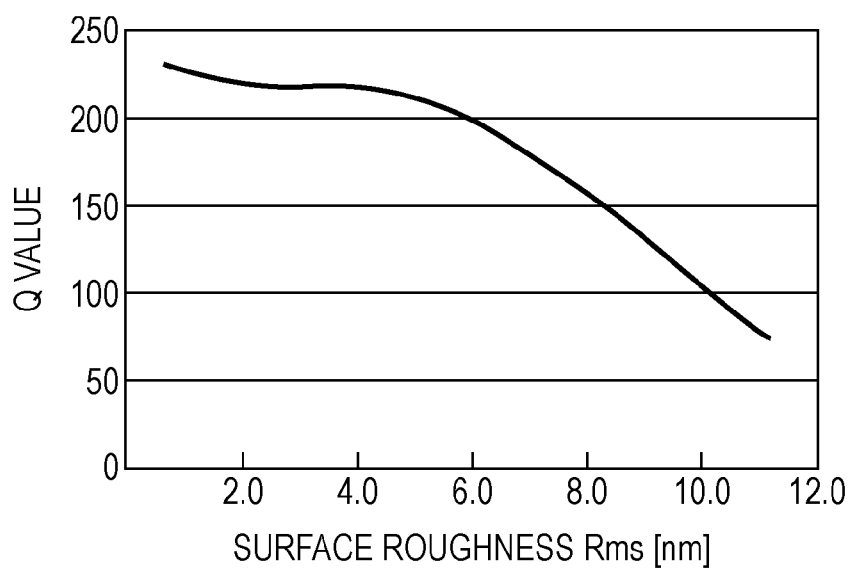
FIG. 3B is a graph showing a relationship between the frequency characteristics of a vibration film and the surface roughness of a first electrode.

FIG. 3A is a graph showing a relationship between the thickness and the surface roughness of a first electrode 13 made of titanium. The graph shows the results when Rms was measured by fixing the RF power to 550 W while increasing the titanium thickness from 50 to 200 nm. FIG. 3B is a graph showing a relationship between the frequency characteristics of a vibration film and the surface roughness of a first electrode 13. The graph shows the results when the frequency characteristics of the vibration film were measured while changing the titanium thickness from 50 to 200 nm as in FIG. 3A.

FIG. 3B shows a relationship of the surface roughness and Q value for evaluating the variation of frequency characteristics. The Q value is a dimensionless number representing a vibration state and is a value obtained by dividing the resonance frequency of a vibration film by the half bandwidth. A higher Q value means that the frequency characteristics of the respective vibration films of the arrayed cell structures 2 are uniform, that is, the variations among the cell structures 2 in the shape of the vibration film and the distance between the electrodes are low.

The frequency characteristics were measured with an impedance analyzer 4294A manufactured by Agilent Technologies Co., Ltd. The results show that the Q value is high, such as 200 or more, when the surface roughness of the first electrode is 6 nm or less and that the Q value sharply decreases in the surface roughness range of larger than 6 nm. In the range where the Q value is 200 or more, the curve partially has a different inclination. This is assumed to be caused by insufficient resolution of the impedance analyzer.

It is understood from FIG. 3B that the surface roughness of the first electrode highly affects the variation in frequency characteristics of a vibration film and that the Q value considerably changes when the surface roughness is increased from the range of 6 nm or less to the range of higher than 6 nm. This relationship does not depend on the material of the first electrode. From the above, the variation among cells or elements in frequency characteristics of vibration films may be reduced by controlling the surface roughness value of the first electrode to 6 nm RMS or less. Thus, the surface roughness value of the first electrode is required to be reduced as much as possible.

In the case of a first electrode made of titanium, the graph shown in FIG. 3A has an inflection point at a titanium thickness of about 100 nm, and the surface roughness sharply increases. Furthermore, the graph has an inflection point at a titanium thickness of about 200 nm, and the increasing rate of the surface roughness is reduced. This is probably because that in a film forming mechanism, the film-forming surface two-dimensionally grows in a film thickness range of a certain level or less and then suddenly transfers to a three-dimensional growth to grow in a mixed state of two-dimensional and three-dimensional growth. This tendency is observed not only in titanium but also in alloys containing titanium such as TiW. Accordingly, in the case of using titanium or an alloy containing titanium as the first electrode of the embodiment, the thickness may be set to 100 nm or less. Furthermore, in the film formation, an island form is changed to a thin film form at a thickness of 10 nm or more, and, consequently, the thickness is 10 nm or more. Thus, the lower limit of the titanium film thickness may be 10 nm or more. Accordingly, the first electrode according to aspects of the embodiments may have a thickness of 10 nm or more and 100 nm or less.

Method of Producing Electromechanical Transducer

Figure 2A:
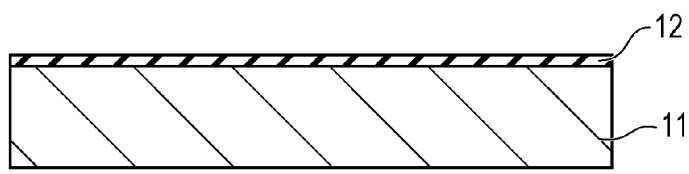
FIGS. 2A to 2G are process diagrams illustrating a method of producing the electromechanical transducer to which Example 1 of one embodiment may be applied.

The method of producing an electromechanical transducer according to aspects of the embodiment will be described with reference to FIGS. 2A to 2G, which are process diagrams illustrating a method of producing the electromechanical transducer shown in FIGS. 1A and 1B. As shown in FIG. 2A, a first insulating film 12 is formed on a substrate 11. In the case where the substrate 11 is an electrically conductive substrate such as a silicon substrate, the first insulating film 12 is formed for insulating between the substrate 11 and the first electrode 13. Accordingly, in the case where the substrate 11 is an insulating substrate such as a glass substrate, the first insulating film 12 may not be formed. The substrate 11 should be a substrate having a surface roughness as low as possible.

Figure 2B:
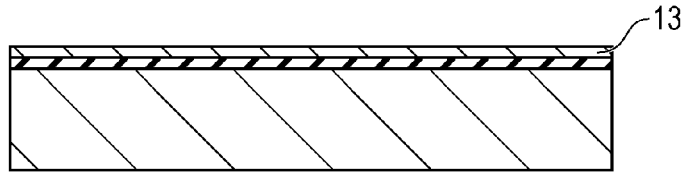

Subsequently, as shown in FIG. 2B, a first electrode 13 is formed on the first insulating film 12. As described above, the first electrode 13 is formed so as to have a surface roughness value of 6 nm RMS or less. In the method of producing an electromechanical transducer by stacking a plurality of layers, the surface roughness of a film is reflected in the subsequent film formation. Accordingly, it is important to reduce the surface roughness in the early step. In particular, in metal film formation, which tends to cause a large surface roughness, a lower surface roughness is important for preventing a variation in characteristics. In the embodiment, the first electrode 13 is formed within a surface roughness of the above-mentioned range, and thereby the variation of frequency characteristics of the vibration film is inhibited from increasing even if the surface roughness is successively reflected to the layers stacked after this step. The first electrode 13 may be made of, for example, titanium or a titanium alloy, which has high electrical conductivity, high-temperature tolerance, and high smoothness.

Figure 2C:
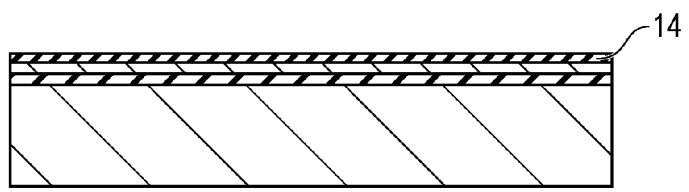

Subsequently, as shown in FIG. 2C, a second insulating film 14 is formed on the first electrode 13. The second insulating film 14 is formed for preventing electrical short between the first electrode and the second electrode or breakdown when a voltage is applied between the first electrode and the second electrode. In the case of driving at a low voltage, the second insulating film 14 may not be formed because that the first membrane is an insulator. If the second insulating film 14 has a high surface roughness, the distance between the first electrode and the second electrode due to the surface roughness varies among the cells or among the elements. Accordingly, the second insulating film 14 also should be made of a material having a low surface roughness. For example, the second insulating film 14 is a silicon nitride film or a silicon oxide film.

Figure 2D:
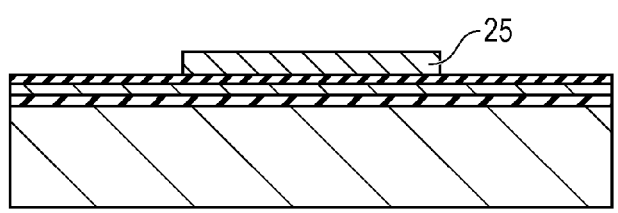

Subsequently, as shown in FIG. 2D, a sacrificial layer 25 is formed on the second insulating film 14. The sacrificial layer 25 is one of factors that determine the shape (depth) of the cavity and therefore should be made of a material that is hardly affected by grain boundaries and crystal anisotropy during etching and has high etching selectivity to other constituents. In addition, in order to shorten the etching time, the sacrificial layer 25 should be made of a material having a high etching rate. Furthermore, the sacrificial layer 25 is required to be made of a material having a low surface roughness. As in the first electrode, if the surface roughness of the sacrificial layer is high, the distance between the first electrode and the second electrode due to the surface roughness varies among the cells or the elements. Accordingly, the sacrificial layer 25 should be made of a material having a low surface roughness, such as chromium or molybdenum.

Figure 2E:
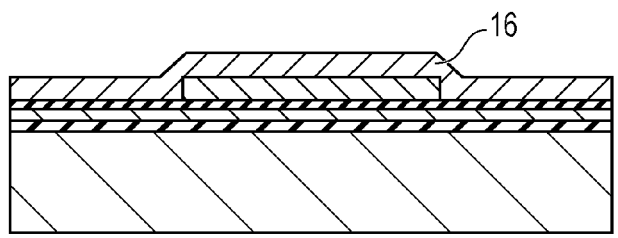

Subsequently, as shown in FIG. 2E, a first membrane 16 is formed on the sacrificial layer 25. A membrane-supporting portion is also formed in this step. The first membrane 16 is required to have a low tensile stress, for example, a tensile stress of higher than 0 MPa and 300 MPa or less. The stress of a silicon nitride film may be controlled by plasma enhanced chemical vapor deposition (PE-CVD) to provide a low tensile stress. If the first membrane 16 has a compression stress, sticking or buckling may be caused to largely deform the vibration film. The sticking is a phenomenon where the first membrane 16 collapses to the first electrode 13 side. If the tensile stress is high, the first membrane may be broken. Accordingly, the first membrane 16 should have a low tensile stress.

Figure 2F:
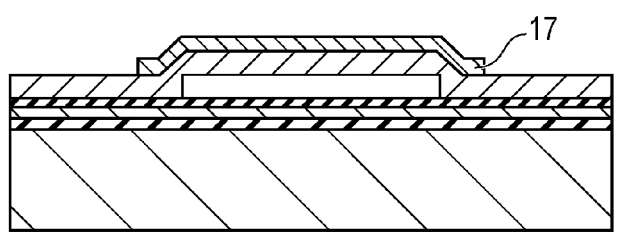

Subsequently, as shown in FIG. 2F, a second electrode 17 is formed, and an etching-hole (not shown) is further formed. Subsequently, the sacrificial layer 25 is removed through the etching-hole to form a cavity. The second electrode 17 is required to be made of a material having a low residual stress, high heat resistance, and etching resistance against the etching of the sacrificial layer. In addition, the second electrode 17 is required to be made of a material that is hardly deteriorated and hardly increases the stress by, for example, the temperature in the later step, i.e., the formation of the second membrane. In the case of a low etching selection ratio, it is necessary to protect the second electrode 17 when the sacrificial layer is etched, resulting in occurrence of variation. Accordingly, the second electrode 17 should be made of a material having etching resistance against the etching of the sacrificial layer. Examples of such a material include titanium and titanium alloys.

Figure 2G:
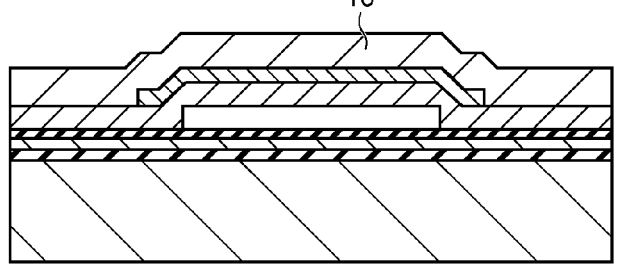

Subsequently, as shown in FIG. 2G, a second membrane 18 is formed. In this step, formation of the second membrane 18 and sealing of the etching-hole are performed in the same step. That is, in this step, the second membrane 18 is formed on the second electrode (on the surface of the second electrode on the opposite side of the cavity), and thereby a vibration film having a predetermined spring constant may be formed, and also a sealing portion that seals the etching-hole may be formed.

In the case where an etching-hole is formed after formation of the second membrane 18 and is then sealed, a film for sealing the etching-hole is deposited on the second membrane. Etching for removing this deposited film causes variations in thickness and stress of the vibration film. On the other hand, in the step of the embodiment, the sealing of the etching-hole and the forming of the second membrane 18 are performed in the same step, and thereby the vibration film may be formed only through film-forming steps.

The second membrane 18 is required to be made of a material having a low tensile stress. As in the first membrane 16, if the second membrane 18 has a compression stress, the first membrane 16 may cause sticking or buckling to largely deform. If the second membrane 18 has a high tensile stress, it may be broken. Accordingly, the second membrane 18 should have a low tensile stress. The stress of a silicon nitride film may be controlled by PE-CVD to provide a low tensile stress.

Subsequently, lead wiring is formed for easily performing electrical connection with the first electrode and the second electrode (the step is not shown). The wiring may be made of a material that has high electrical conductivity and suitable for assembly, such as aluminum.

In the electromechanical transducer produced by this method, the variation in the frequency characteristics of the vibration film may be decreased. In addition, in the electromechanical transducer produced by this method, the vibration film may be formed only by film-forming steps. Accordingly, the variation in thickness of the vibration film may be reduced, and thereby the variations among the cells or elements in sensitivity and bandwidth of the electromechanical transducer may be reduced.

A Preferred Embodiment of the Present Invention

The substrate according to aspects of the embodiments may be any substrate such as a semiconductor substrate, a glass substrate, a ceramic substrate, or a multiple substrate thereof. In the case where the substrate 11 is an insulator such as a glass substrate, the first insulating film 12 may not be disposed. In particular, a silicon substrate may be used as the substrate 11, and a thermal oxide film may be used as the first insulating film 12. In particular, a silicon substrate having a thermal oxide film may be used as a substrate having high smoothness.

The first electrode 13 may be made of titanium or a titanium alloy. The surface roughness of a titanium film used as the first electrode may be precisely controlled by controlling the RF power of a sputtering apparatus. Since titanium has high heat-resistance, deformation and deterioration due to high temperature in subsequent steps may be prevented. Surface roughness is reflected in the film formed in the next step by the stacking. Accordingly, it is important to reduce the surface roughness in the early step.

The second insulating film 14 may be made of silicon oxide. A silicon oxide film formed by PE-CVD has high insulation properties and smoothness and is excellent in step coverage. Since a high voltage is applied between the first electrode 13 and the second electrode 17, the silicon oxide film having a high insulation property and being excellent in step coverage may provide a low surface roughness to the subsequent step and therefore may be used.

The first membrane 16 and the second membrane 18 may be made of silicon nitride. A silicon nitride film formed by PE-CVD may generally obtain a tensile stress. In order to prevent a vibration film from being largely deformed by a residual stress of a silicon nitride film, a low tensile stress is required. In the electromechanical transducer according to aspects of the embodiments, the second electrode 17 is disposed between the first membrane 16 and the second membrane 18. This configuration may reduce the distance between the first electrode and the second electrode compared with that in the case where the second electrode 17 is disposed on the second membrane 18, resulting in an increase in conversion efficiency.

The conversion efficiency herein is the efficiency of converting vibration of a vibration film into an electrical signal. The conversion efficiency is increased with a decrease in the distance between the first electrode and the second electrode. In the case of a vibration film composed of a combination of materials having different thermal expansion coefficients, the vibration film is warped by a bimetal effect. However, the stresses may be well balanced by disposing the second electrode 17 between the first membrane 16 and the second membrane 18 which are made of the same material, and thereby the warp of the vibration film may be reduced. As a result, the vibration film may be prevented from being largely deformed.

The second electrode 17 may be made of titanium or a titanium alloy by electron-beam evaporation, and a titanium film formed by electron-beam evaporation under a low degree of vacuum may have a tensile stress. If the second electrode 17 is formed with a high compression stress, the stress balance of the second electrode 17 on the first membrane 16 may cause a large deformation of the vibration film, and thereby the variation in bending of the vibration film is increased. In order prevent the vibration film from being largely deformed, the second electrode 17 should have a low tensile stress. Since titanium has high heat-resistance, deterioration due to high temperature in the step of forming the second membrane may be prevented. In addition, titanium may reduce the surface roughness, and thereby variation in bending of the membrane may be prevented.

EXAMPLES

The embodiments will be described in detail by using more specific examples.

Example 1

An aspect of the embodiments will be described with reference to FIGS. 1A and 1B. FIG. 1A is a top view illustrating an electromechanical transducer of one embodiment, and FIG. 1B is a cross-sectional view taken along line IB-IB of FIG. 1A. The element 1 of this Example includes nine cell structures 2.

In FIG. 1B, a cell structure 2 includes a silicon substrate 11 having a thickness of 300 μm, a first insulating film 12 disposed on the silicon substrate 11, a first electrode 13 disposed on the first insulating film 12, and a second insulating film 14 on the first electrode 13. The cell structure 2 further includes a vibration film composed of a first membrane 16, a second membrane 18, and a second electrode 17. The first membrane 16 is supported by a membrane-supporting portion 19, and the first electrode 13 and the second electrode 17 are arranged so as to oppose to each other with the cavity 15 therebetween.

The first insulating film 12 is a silicon oxide film having a thickness of 1 μm formed by thermal oxidation. The first electrode 13 is formed of titanium using a sputtering apparatus so as to have a thickness of 50 nm and a surface roughness of 2 nm as the Rms. The second insulating film 14 is a silicon oxide film formed by PE-CVD. The second insulating film 14 reflects the surface roughness of the first electrode 13 and therefore has substantially the same Rms value as that of the first electrode 13. The first electrode 13 of this Example is formed on the entire surface of the element 1. In the case where a plurality of elements are arranged in an array form, an electrical signal may be extracted from each element separately by using the first electrode 13 as a common electrode electrically connected to all the plurality of the elements and the second electrode 17 electrically separated on an element-to-element basis. Alternatively, the second electrode 17 may be used as a common electrode, and the first electrode 13 may be separated on an element-to-element basis. Furthermore, both the first electrode 13 and the second electrode 17 may be separated on an element-to-element basis.

The second electrode 17 is formed of titanium using an electron-beam evaporator so as to have a thickness of 100 nm and a tensile stress of 200 MPa or less. The first membrane 16 and the second membrane 18 are each a silicon nitride film formed by PE-CVD so as to have a tensile stress of 100 MPa or less and diameter of 45 μm. The thicknesses of the first membrane 16 and the second membrane 18 are 0.4 μm and 0.7 μm, respectively. The second electrode 17 has a diameter of 40 μm. The cavity 15 has a thickness of 0.18 μm. The thickness of the second membrane 18 is about four times that of the cavity 15. Accordingly, the etching-hole may be filled with the insulating film serving as the second membrane 18 to satisfactorily seal the cavity 15.

The thickness of the first membrane 16 is smaller than that of the second membrane 18, and the spring constant of the membranes is adjusted to a predetermined value by controlling the thickness of the second membrane 18. As a result, a vibration film having a predetermined spring constant may be formed only through film-forming steps without etching the film serving as the second membrane 18.

The electromechanical transducer of this Example may extract an electrical signal from the second electrode 17 of each element separately by using lead wiring 6.

In the case of receiving ultrasonic waves by the electromechanical transducer, the power supply unit (not shown) applies a DC voltage to the first electrode 13. Reception of ultrasonic waves deforms the first membrane 16 having the second electrode 17 and the second membrane 18 to change the depth of the cavity 15 between the second electrode 17 and the first electrode 13, resulting in a change in capacitance. This change in capacitance causes a flow of an electric current (electrical signal) in the lead wiring 6. This current is converted into a voltage by a current-voltage conversion device (not shown) to give an input signal of the ultrasonic waves.

In the case of transmitting ultrasonic waves, a DC voltage and an AC voltage are applied to the first electrode 13 and the second electrode 17, respectively, and the electrostatic force vibrates the vibration film. This vibration transmits ultrasonic waves.

Example 2

Figure 4A:
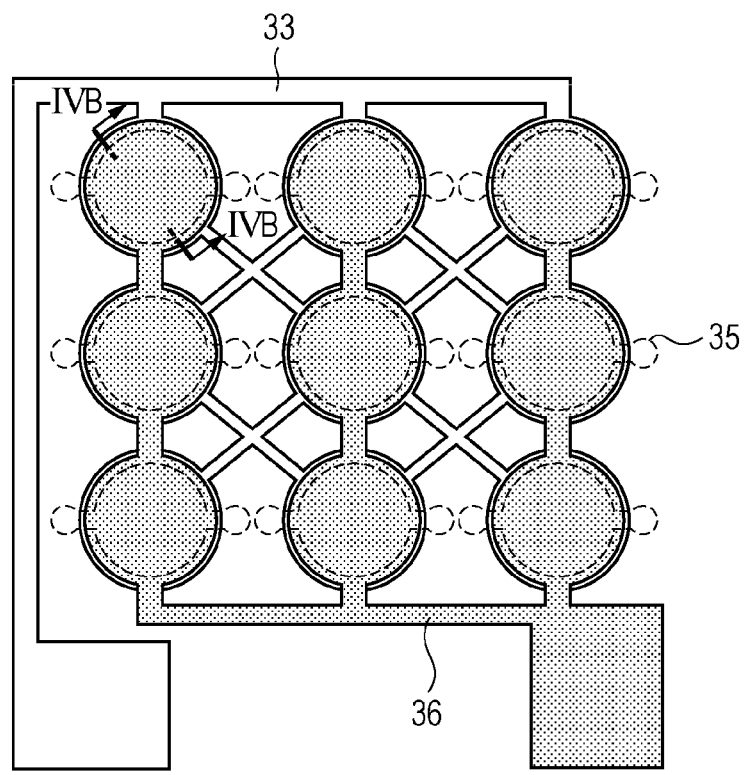
FIGS. 4A and 4B are schematic diagrams illustrating an electromechanical transducer to which Example 2 according to aspects of the embodiments may be applied.
Figure 4B:
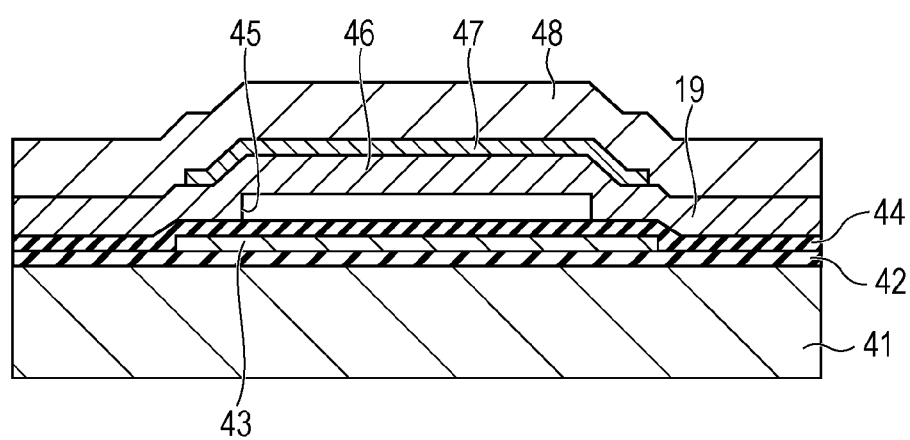

Example 2 according to aspects of the present invention will be described with reference to FIGS. 4A and 4B. FIG. 4A is a top view illustrating the electromechanical transducer according to this Example, and FIG. 4B is a cross-sectional view taken along line IIB-IIB of FIG. 4A. The configuration of the electromechanical transducer of Example 2 is the same as that of Example 1 excepting the shape of the first electrode.

As shown in FIG. 4B, the cell structure includes a silicon substrate 41 having a thickness of 300 µm, a first insulating film 42 disposed on the silicon substrate 41, a first electrode 43 disposed on the first insulating film 42, and a second insulating film 44 on the first electrode 43. The cell structure further includes a vibration film composed of a first membrane 46, a second membrane 48, and a second electrode 47. The first membrane 46 is supported by a membrane-supporting portion 49. The first electrode 43 and the second electrode 47 are arranged so as to oppose to each other with a cavity 45 therebetween.

The first insulating film 42 is a silicon oxide film having a thickness of 1 µm formed by thermal oxidation. The first electrode 43 is formed of titanium so as to have a thickness of 50 nm and a surface roughness of 2 nm as the Rms using a sputtering apparatus. Furthermore, in this Example, in order to reduce the unnecessary parasitic capacitance formed by the wiring of the first electrode and the wiring of the second electrode at positions other than the cavity, the first electrode is patterned so as to reduce the area where the wiring of the first electrode and the wiring of the second electrode overlap each other as small as possible.

Titanium may be precisely patterned to form the first electrode 43 as shown in the drawing by employing photolithography and etching. A high etching selection ratio to other constituents may be achieved by using a solution containing a perchloric acid as an etchant, and thereby a first electrode having notably high smoothness and maintaining the low surface roughness may be obtained without deteriorating the peripheral materials. Thus, the first electrode 43 and the second electrode 47 have approximately the same size, and the cells are connected to one another with a thin wiring 33. The parasitic capacitance may be reduced by arranging the wiring 33 of the first electrode 43 and the wiring 36 of the second electrode 47 not to oppose to each other with an insulating film therebetween. The second insulating film 44 is a silicon oxide film formed by PE-CVD.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-084673 filed Apr. 6, 2011, which is hereby incorporated by reference herein in its entirety.

What is claimed is:

1. An electromechanical transducer comprising:
    a substrate;
    a first electrode disposed on the substrate; and
    a vibration film including a membrane disposed on the first electrode with a space therebetween and a second electrode disposed on the membrane so as to oppose the first electrode, wherein
    the first electrode has a surface roughness value of 6 nm RMS (root-mean-square) or less.

2. The electromechanical transducer according to claim 1, wherein the first electrode is disposed on the substrate with a first insulating film therebetween.

3. The electromechanical transducer according to claim 1, further comprising:
    a second insulating film on the first electrode, wherein
    the space is formed between the second insulating film and the first membrane.

4. The electromechanical transducer according to claim 1, wherein
    the membrane is composed of a first membrane and a second membrane, wherein the first membrane is disposed on the second electrode on the space side, and the second membrane is disposed on the second electrode on the opposite side of the space; and
    the vibration film is constituted of the first membrane, the second electrode, and the second membrane.

5. The electromechanical transducer according to claim 1, wherein the first electrode comprises titanium or an alloy containing titanium.

6. The electromechanical transducer according to claim 1, wherein the first electrode has a thickness of 10 nm or more and 100 nm or less.

7. The electromechanical transducer according to claim 1, wherein the space is formed by etching a sacrificial layer formed on the first electrode, after formation of the membrane.

8. The electromechanical transducer according to claim 3, wherein the space is formed by etching a sacrificial layer formed on the second insulating film, after formation of the membrane.

9. The electromechanical transducer according to claim 1, wherein the first electrode comprises tungsten.

10. The electromechanical transducer according to claim 1, wherein the substrate comprises a silicon substrate.

11. The electromechanical transducer according to claim 1, wherein the first insulating film comprises silicon oxide.

12. The electromechanical transducer according to claim 1, wherein the second insulating film comprises silicon oxide.

13. The electromechanical transducer according to claim 1, further comprising a element including a plurality of cell structures, wherein each of the plurality of cell structures comprises the first electrode and the vibration film.

14. The electromechanical transducer according to claim 13, further comprising a plurality of the elements, wherein an electrical signal from the first or second electrode is output separately for each of the elements.

15. An apparatus comprising the electromechanical transducer according to claim 1 and a voltage applying unit, wherein the voltage applying unit applies a voltage between the first and second electrodes so that the electromechanical transducer receives an ultrasonic wave and output a current.

16. An apparatus comprising the electromechanical transducer according to claim 1 and a voltage applying unit, wherein the voltage applying unit applies a DC voltage to the first electrode and applies an AC voltage to the second electrode so that the electromechanical transducer transmits an ultrasonic wave.

17. An apparatus comprising the electromechanical transducer according to claim 1 and a voltage applying unit, wherein the voltage applying unit applies a DC voltage to the second electrode and applies an AC voltage to the first electrode so that the electromechanical transducer transmits an ultrasonic wave.

* * * * *